(12) United States Patent
Aton et al.

(10) Patent No.: US 6,208,151 B1
(45) Date of Patent: Mar. 27, 2001

(54) METHOD AND APPARATUS FOR MEASUREMENT OF MICROSCOPIC ELECTRICAL CHARACTERISTICS

(75) Inventors: Thomas John Aton, Dallas; Leigh Ann Files, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/216,204

(22) Filed: Dec. 18, 1998

Related U.S. Application Data

(60) Provisional application No. 60/068,630, filed on Dec. 23, 1997.

(51) Int. Cl.[7] ................................................. G01R 31/00
(52) U.S. Cl. ........................................... 324/691; 324/718
(58) Field of Search ................................ 324/718, 719, 324/716, 765, 713, 715, 724, 691

(56) References Cited

U.S. PATENT DOCUMENTS

| | | | |
|---|---|---|---|
| 4,178,543 | * 12/1979 | Wrinn et al. | ............ 324/718 |
| 4,918,377 | * 4/1990 | Buehler et al. | ............ 324/691 |
| 5,530,372 | * 6/1996 | Lee et al. | ............ 324/758 |
| 5,723,981 | * 3/1998 | Hellemans et al. | ............ 324/719 |

* cited by examiner

*Primary Examiner*—Safet Metjahic
*Assistant Examiner*—Vincent Q. Nguyen
(74) *Attorney, Agent, or Firm*—Jacqueline J. Garner; Wade James Brady, III; Frederick J. Telecky, Jr.

(57) ABSTRACT

The improved method for microscopic measurement of electrical characteristics comprises a standard atomic force microscope (AFM). The AFM includes a pointed, conductively coated tip attached to one end of a softly compliant cantilever arm, also capable of conducting electricity. The other end of the cantilever arm is attached to the top of a piezo-electric z-axis driver which will raise and lower the cantilever arm as the AFM tip is scanned across the surface of a sample. A piezo-electric X-Y scanstage controller may also be provided and connected to the bottom of the z-axis driver. The X-Y scanstage is preferably capable of scanning the movement of the entire system including the Z-axis driver, cantilever arm and AFM tip.

21 Claims, 3 Drawing Sheets

METHOD AND APPARATUS FOR MEASUREMENT OF MICROSCOPIC ELECTRICAL CHARACTERISTICS

This application claims priority under 35 USC §119(e)(1) of provisional application No. 60/068,630, filed Dec. 23, 1997.

TECHNICAL FIELD OF THE INVENTION

The present invention relates generally to measurement of electrical characteristics, and more particularly to an improved method and apparatus for measurement of selected electrical characteristics in integrated circuits and small scale semiconductor materials.

BACKGROUND OF THE INVENTION

As the size of semiconductor devices decreases, it becomes much more difficult to accurately measure the electrical characteristics of the devices. This is particularly true for very large scale integrated circuits fabricated on semiconductor wafers with very small spacing between components, especially those fabricated with low resistance metals and other types of electrically conducting materials. Currently, there are several methods and associated equipment for measuring electrical characteristics of complex transistor-size integrated circuits. These methods include scanning capacitance microscopy and the use of scanning tunneling microscopes (STM), as well as atomic force microscopes (AFM).

One method common to the art involves using a scanning probe connected to a voltmeter to measure the voltage drop across a sample of electrically conductive material attached to a current source. Accurate measurements are sometimes difficult to obtain with this method because the electric potential of the contact between the probe and the sample may vary with position and be large enough to affect the measurement.

In order to overcome problems associated with contact potential, a second type of measurement uses a voltmeter permanently affixed to opposite ends of the sample. An electron microscope may then be used as a current source and used to supply current to selected portions of the sample. While this method successfully overcomes the problems associated with the electric contact potential, it is also sometimes difficult to achieve accurate results. In order to use an electron microscope, the sample must be measured in a vacuum. Also, the available beam current is small in electron microscopes and this limits accuracy.

Many of the methods and equipment used for measuring electrical characteristics of integrated circuits at a microscopic level lack sufficient spatial resolution. It is difficult to conduct reliable measurements on microscopic devices or samples.

SUMMARY OF THE INVENTION

Accordingly, a need has arisen in the art for an improved method for microscopic measurement of electrical characteristics. The present invention provides a method and apparatus for microscopic measurement of electrical characteristics that substantially eliminates or reduces problems associated with the prior methods for measurement of microscopic electrical characteristics.

In accordance with one aspect of the present invention, a method and apparatus for microscopic measurement of electrical characteristics may include a standard atomic force microscope (AFM). The AFM may have a small, pointed electrically conductive AFM tip attached to one end of a softly compliant AFM cantilever arm which includes an electrically conductive path to the tip. The other end of the cantilever arm may be attached to the top of a piezo-electric z-axis driver which will raise and lower the cantilever arm as the AFM tip is scanned across the surface of a sample. A piezo-electric X-Y scanstage may also be provided and connected to the z-axis driver. The X-Y scanstage is preferably capable of scanning the movement of the entire system including the z-axis driver, cantilever arm and AFM tip.

The AFM arm may be connected to a current source with one or more electrically conductive leads. The current source may also be connected to a sample. The AFM, leads and sample cooperate with each other to create a circuit for the flow of electricity from the current source through the sample. More specifically, a voltmeter may be connected to other points on the sample with electrically conductive leads. The voltage from this meter can be used with some measure of the electrical current to determine the microscopic electrical characteristics of the sample.

Technical advantages of the present invention include providing a more efficient method of measuring microscopic electric fields. By using an AFM to inject or supply current at selected locations in a sample and simultaneously measuring the voltage drop, electrical characteristics such as variations in resistance or conductivity throughout the sample may be accurately measured. Also, the present invention allows such measurements to be taken in a normal atmospheric environment (no vacuum required).

Further technical advantages of the present invention include providing a system of measurement of microscopic electrical characteristics utilizing currents larger than those commonly available in scanning electron microscopes. Also, methods and apparatus within teachings of the present invention allow accurate measurements of electrical characteristics to be conducted on a smaller scale and at a reduced cost in comparison with conventional microscopic electrical characteristic measurement methods.

Other technical advantages will be readily apparent to one skilled in the art from the following figures, descriptions and claims.

DESCRIPTION OF THE DRAWINGS

For a more complete understanding of the present invention and its advantages thereof, reference is now made to the following brief description, taken in conjunction with the accompanying drawings and detailed description, wherein like reference numerals represent like parts, in which.

DETAILED DESCRIPTION OF THE INVENTION

The preferred embodiments of the present invention and its advantages are best understood by referring now in more detail to FIGS. 1–8 of the drawings, in which like numerals refer to like parts.

For purposes of the present application, the term "sample" is used to refer to any conductive or semiconductive material patterned on or within a substrate. The substrate will typically be formed from non-conducting material and function as an electrical insulator.

For purposes of the present application, the term "electrical characteristics" is used to refer to any property of a material associated with its electrical performance and can include resistivity, conductivity, electrical field, i-v characteristics of a diode, or the depth and width of a P-N junction.

Figure 1:
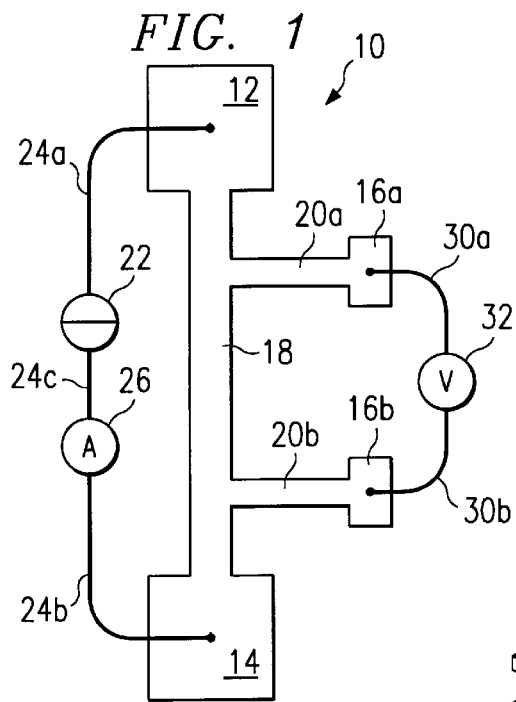
FIG. 1 is a schematic drawing in plan representing a traditional method and apparatus for measuring the voltage and current characteristics of a four-pronged sample.

Referring to FIG. 1, a system for measuring the electrical conductivity of sample 10 is illustrated. Traditional electrical conductivity measurements involve measurements conducted on a four-pronged sample such as sample 10. Sample 10 includes first end node 12 and second end node 14 as well as side nodes 16a and 16b. Rectangular arm 18 connects first end node 12 and second end node 14. Branch arms 20a and 20b connect nodes 16a and 16b respectively with arm 18. Initially, a current source 22 and ammeter 26 are connected to each other with wire lead 24c. Current source 22 is then attached to sample 10 at first end node 12 with wire lead 24a. Next, ammeter 26 is attached to sample 10 at second end node 14 with wire lead 24b. Finally, voltmeter 32 is connected across nodes 16a and 16b with wire leads 30a and 30b respectively.

Current source 22 will provide current to sample 10 which will flow through the electrical circuit created by wire lead 24a, first end node 12, rectangular arm 18, second end node 14, wire lead 24b, ammeter 26 and wire lead 24c. Ammeter 26 is usually selected to have an input impedance of nearly zero. As such, the presence of ammeter 26 will have a negligible effect on the current flowing through.

Voltmeter 32, on the other hand, is selected to have a nearly infinite input impedance which will prevent a significant current flow from entering branch arms 20a or 20b. This is due to the fact that voltmeter 32 is a device designed to measure voltage but not to allow current to flow therethrough. Since no current is flowing through wire leads 30a or 30b, the voltage drop across the wires will not affect the measurement of the voltage drop across the portion of arm 18 between branch arms 20a and 20b of sample 10. By measuring the voltage across this portion of arm 18, the resistance can be determined since the current supplied by current source 22 is already known from ammeter 26. By using a total of four electrical connections or nodes, configured as illustrated in FIG. 1, the resistance of wire leads 24a, 24b, 24c, 30a and 30b, branch arms 20a and 20b, side nodes 16a and 16b, first end node 12 or second end node 14 will not affect the measurement of the electrical characteristics of sample 10.

Figure 2:
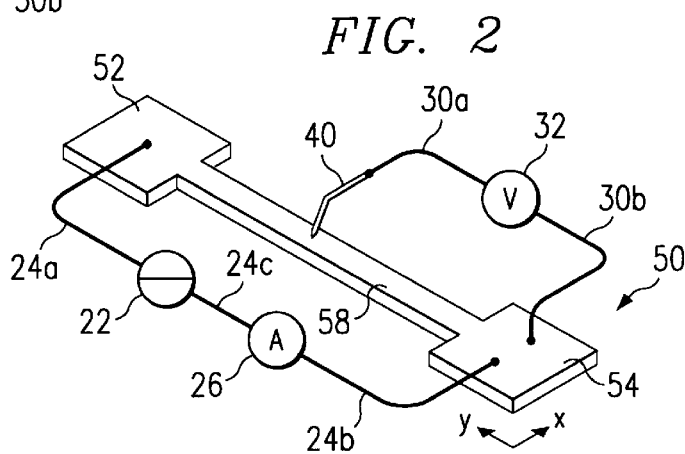
FIG. 2 is a schematic drawing showing an isometric view illustrating a system for measuring the voltage drop across a two-pronged sample using a scanning electrical probe to measure the voltage at various locations along the two-pronged sample while current is simultaneously driven through the sample.

Referring now to FIG. 2, two-pronged sample 50 is provided. Sample 50 includes first end node 52, second end node 54 and rectangular arm 58. Current source 22 is connected to sample 50 at first end node 52 with wire lead 24a. Current source 22 is also connected to ammeter 26 with wire lead 24c. Ammeter 26 is connected to sample 50 at second end node 54 with wire lead 24b. Voltmeter 32 is connected to sample 50 at second end node 54 with wire lead 30b. Wire lead 30a connects voltmeter 32 to a scannable conductive probe 40.

The system shown in FIG. 2 allows measurement at selected locations of the voltage drop across sample 50. Voltmeter 32 will measure the voltage drop across sample 50 between the point where second end node 54 connects to wire lead 30b and the location where probe 40 makes contact with sample 50. This method of determining voltage drop across sample 50 is equivalent to the method of FIG. 1, but it will allow scanning of the entire sample 50 to determine the correlation between the location of probe 40 along sample 50 with the voltage drop measured by voltmeter 32. Unfortunately, the system of electric field measurement illustrated by FIG. 2 will often be hindered by variations in the electrical potential of the contact between Probe 40 and sample 50. The contact potential will vary for example when oxides or particulate contaminates on the sample are encountered by Probe 40.

Figure 3:
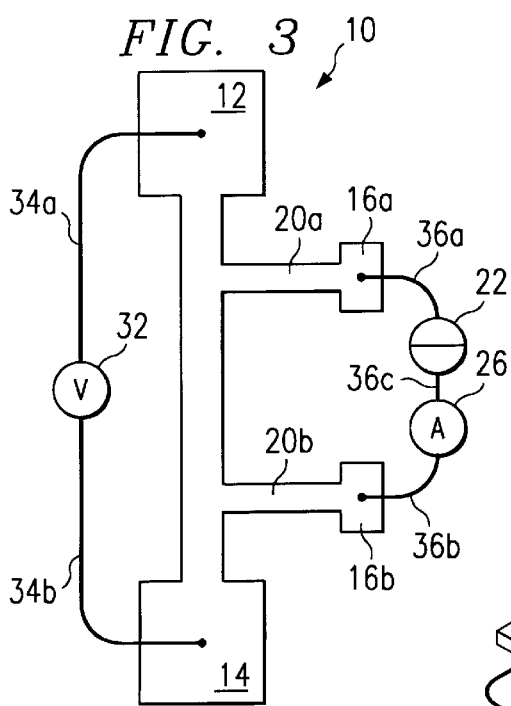
FIG. 3 is a schematic drawing in plan illustrating a system similar to FIG. 1 where the location of the voltmeter has been interchanged with the location of the ammeter and current source.

Referring now to FIG. 3, sample 10 is illustrated with voltmeter 32 connected to first end node 12 with wire lead 34a. Voltmeter 32 is also connected to second end node 14 with wire lead 34b. In this alternative embodiment of the system illustrated in FIG. 1, current source 22 is connected to node 16a with wire lead 36a. Wire lead 36c connects current source 22 to ammeter 26. Ammeter 26 is connected to node 16b with wire lead 36b. For the system displayed in FIG. 3, current will flow through in the electrical circuit created by current source 22, wire lead 36c, ammeter 26, wire lead 36b, side node 16b, branch arm 20b, the portion of rectangular arm 18 which connects branch arms 20a and 20b, branch arm 20a, side node 16a and wire lead 36a. Again, due to the very low input impedance of ammeter 26, and the nearly infinite input impedance of voltmeter 32, the current generated by current source 22 will not travel through first end node 12, second end node 14 or voltmeter 32.

According to the Reciprocity Theorem, the current and voltage relationship recorded when the system is configured as illustrated in FIG. 3 will be exactly the same as when the system is configured as illustrated in FIG. 1. The Reciprocity Theorem applies to linear networks of the type illustrated in FIGS. 1–4. Simply stated, the Reciprocity Theorem establishes, "the ratio of a single excitation applied at one point to an observed response at another point is invariant with respect to an interchange of the points of excitation and observation."

Figure 4:
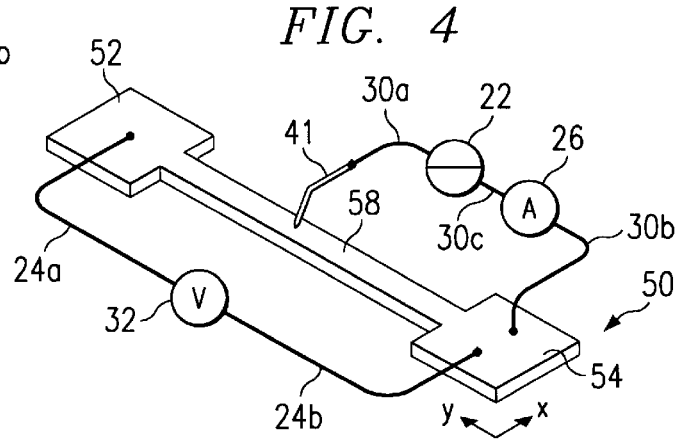
FIG. 4 is a schematic drawing showing an isometric view illustrating a system similar to FIG. 2 where the location of the voltmeter has been interchanged with the location of the ammeter and current source.

Thus, a more effective method of scanning a two-prong sample to determine variations in selected electrical characteristics of sample 50 is illustrated in FIG. 4. FIG. 4 illustrates a system for electric field measurement similar to the system of FIG. 2, wherein the location of voltmeter 32 has been interchanged with current source 22 and ammeter 26. In the system of FIG. 4, voltmeter 32 is permanently affixed to sample 50 at first end node 52 and second end node 54. Probe 40 of the system of FIG. 2 is replaced by electrically conductive probe 41. Conductive probe 41 is selected to be suitable for injecting current into sample 50 at a desired location and also capable of being scanned over the exterior of sample 50 in such a manner that the voltage (V) may be determined as a function of the location of conductive probe 41 on sample 50. Throughout this application, the term "scan" or "scanned" refers to the situations where a device is continuously moved across the surface of a sample, or the device is consecutively connected to a series of points on the sample. Conductive probe 41 is used to inject current into sample 50 by connecting conductive probe 41 to current source 22. Current flow within the electrical circuit defined by current source 22, wire lead 30a, conductive probe 41, rectangular portion 58 of sample 50, bottom mode 54, wire lead 30b, ammeter 26 and wire lead 30c will be measured by ammeter 26.

The system illustrated in FIG. 4 will not generally encounter the same problems with contact potential as the system of FIG. 2. Current source 22 is preferably selected to be capable of supplying the same level of current flow without regard to variations in electrical potential between probe 41 and sample 50. Importantly, variations in contact potential do not affect electrical potential measured by voltmeter 32 across rectangular arm 58 because the contact potential of the current loop created by conductive probe 41, wire lead 30a, current source 22, ammeter 26, second end node 54, and arm 58, is not inside the voltage measurement loop created by first end node 52, arm 58, second end node 54, wire lead 24b, voltmeter 32, and wire lead 24a. The electrical potential variation relative to the location of probe 41 on sample 50 can be determined independent of the variation of the contact potential of probe 41 on sample 50.

Figure 5:
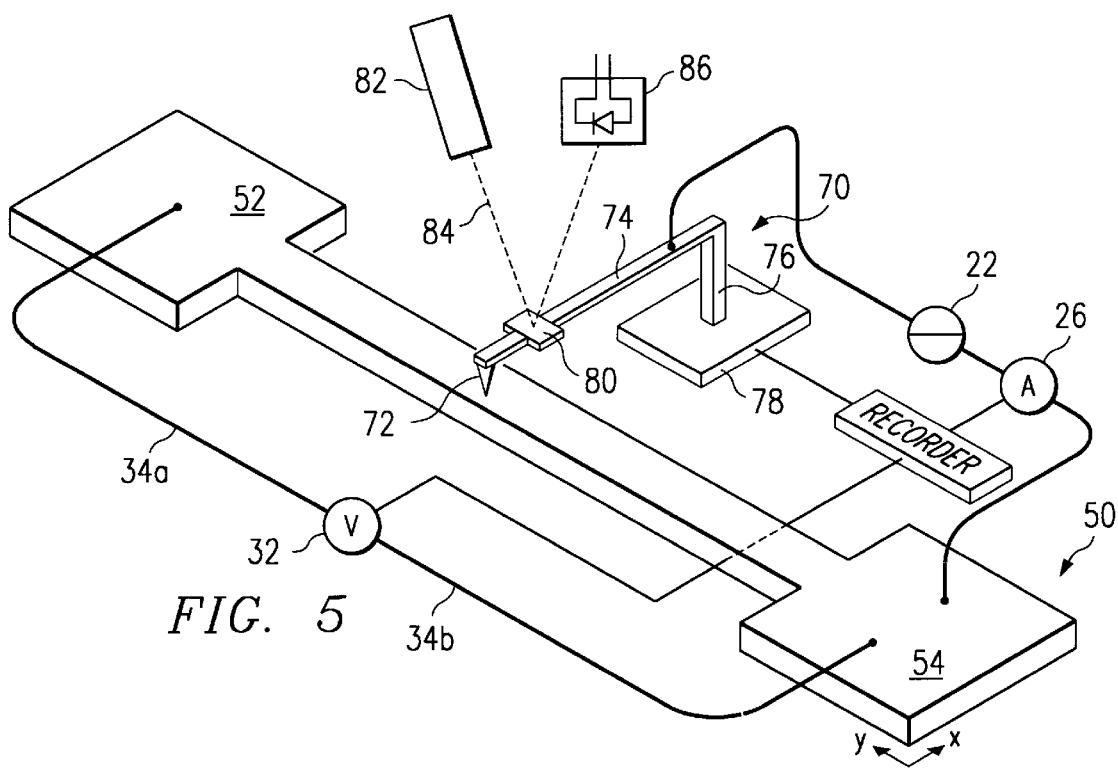
FIG. 5 is a schematic drawing showing an isometric view, with portions broken away, illustrating one embodiment of the present invention for determining electrical characteristics in a microscopic conducting sample.

One embodiment of the present invention is illustrated in FIG. 5. The system of FIG. 5 includes atomic force microscope (AFM) probe 70 which is used to inject current into sample 50 at selected locations. Probe 70 is electrically conductive. Although many scanning probes are available and suitable for incorporation into the present invention, an atomic force microscope is utilized in the embodiment of FIG. 5 to achieve better resolution on small scale samples (i.e., 0.1 micron sample dimension). Voltmeter 32 is attached to sample 50 at first end node 52 and second end node 54, with wire leads 34a and 34b respectively. Current source 22 and ammeter 26 are connected to one another and ammeter 26 is attached to sample 50 at second end node 54. Current source 22 is attached to AFM probe 70.

AFM probe 70 preferably includes pointed AFM tip 72 which is attached to one end of a softly compliant AFM cantilever arm 74. AFM tip 72 may be coated with electrically conductive material or formed from electrically conductive material. AFM cantilever arm 74 is also provided with the capability to conduct electricity. The outer end of cantilever arm 74 is mounted on piezo-electric Z-axis driver 76 which will move to allow AFM cantilever arm 74 and AFM tip 72 to follow the surface of sample 50 as tip 72 is scanned across the surface of sample 50. Z-axis driver 76 is also attached to piezo-electric X-Y scanstage controller 78. X-Y scanstage controller 78 has the ability to scan arm 70 and tip 72 across sample 50 and monitor and record the movement of AFM 70 as AFM tip 72 is scanned across sample 50.

As is known in the art of scanning atomic force microscopes, in one embodiment of the present invention mirror 80 is attached to AFM cantilever arm 74. Light source 82 is directed toward mirror 80. Light source 82 may include any system for directing light to a location. For the purposes of the present invention, light source 82 may be a laser. Light waves 84 are emitted from light source 82, deflected by mirror 80 and detected by photo detector 86. Photodetector 86 is preferably a split photo diode in the present embodiment of this invention. Photo detector 86 detects the angular displacement of AFM cantilever arm 74 as it is scanned over sample 50. The signal from the deflection is used to correct Z-axis driver 76 to force the sample tip to follow any topography. The electrical configurations for accomplishing this surface scanning are well known in the art and not illustrated here. Indeed, other forms for microscopic scanning of a suitable conductive probe on a scale of semiconductor device sizes might be substituted for the atomic force microscope. The voltage read by voltmeter 32 and the current read by ammeter 26 at a location of the x-y scanstage controller 78 can be recorded in a recorder 91 which is shown coupled to the voltmeter, ammeter and x-y scanstage.

Figure 6:
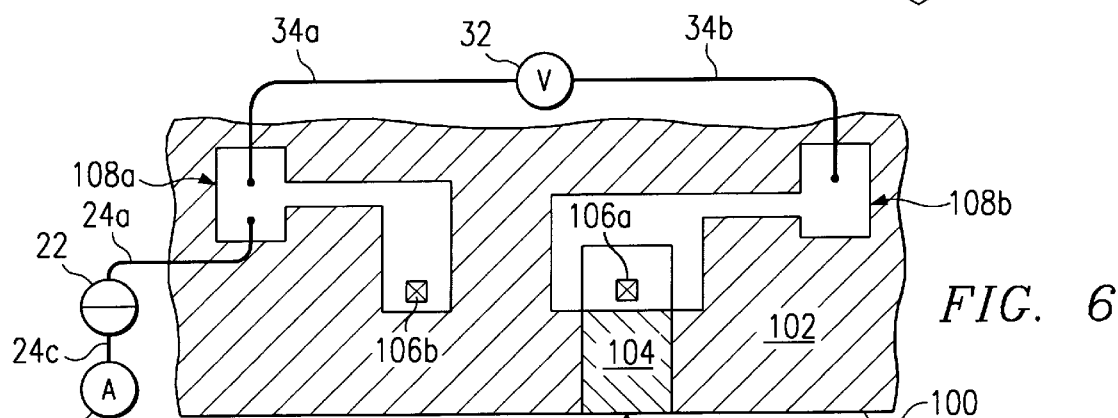
FIG. 6 is a schematic drawing in section with portions broken away illustrating another embodiment of the present invention for determining electrical characteristics in a sample that includes a P-N junction.
Figure 7:
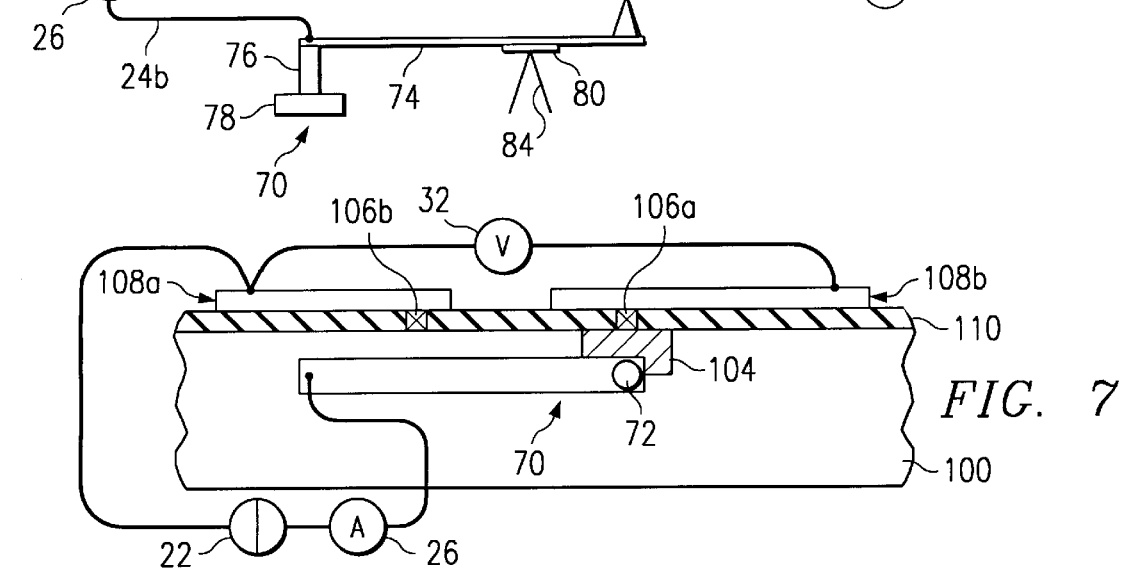
FIG. 7 is a schematic drawing in section and in elevation with portions broken away illustrating a side view of the system of FIG. 6.
Figure 8:
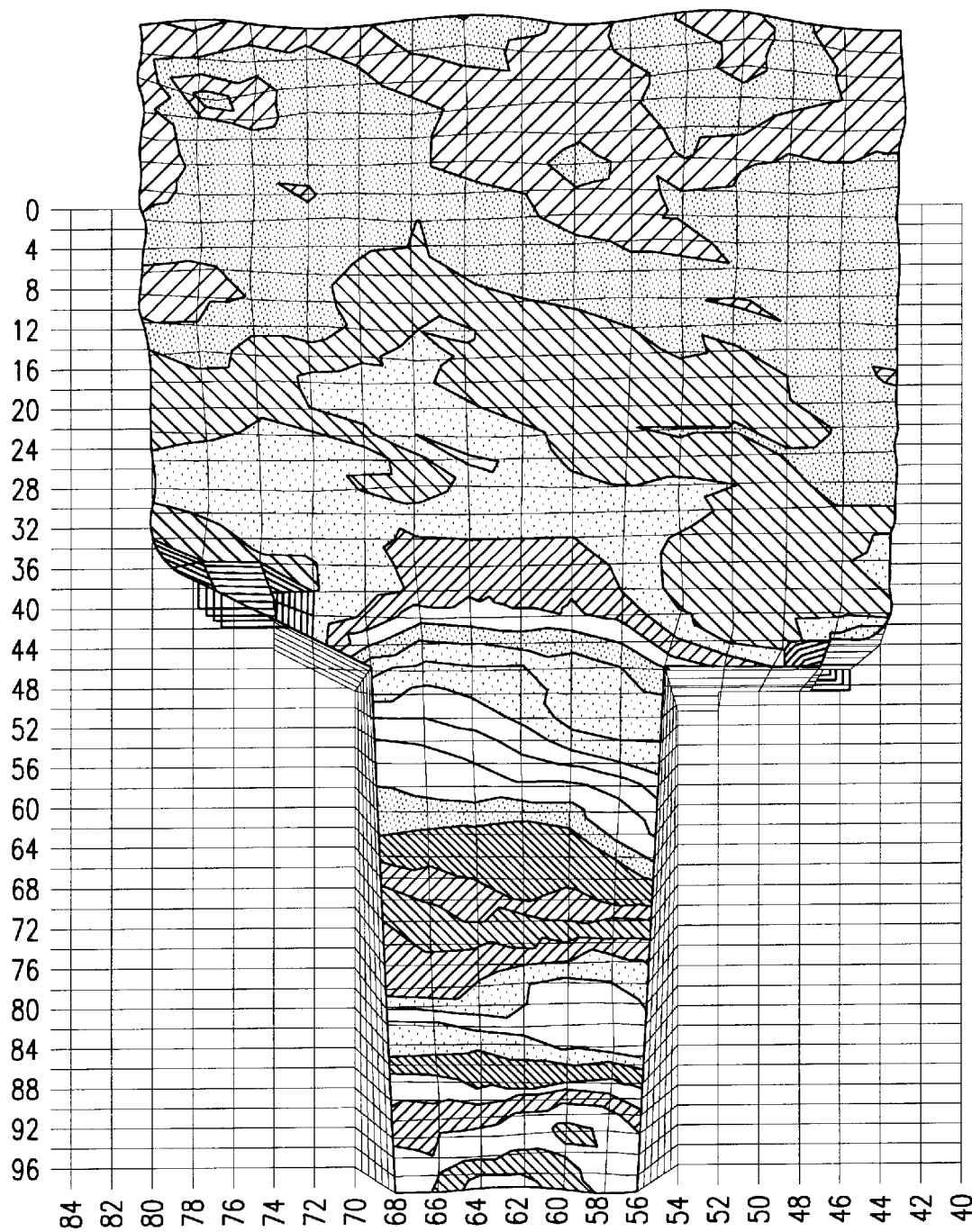
FIG. 8 is a graphic representation of an electrical potential map showing a set of equal potential lines generated by equipment and methods incorporating the teachings of the present invention.

Alternative embodiments of the present invention are illustrated in FIGS. 6 and 7, where a method of profiling a P-N junction is disclosed. In FIG. 6, the polished edge of semiconductor device 100 is shown. P region 102 of semiconductor device 100 which contains impurity elements that create equivalent positive charge carriers is crosshatched for clarity. N region 104 defines the area of semiconductor device 100 where impurities create negative charge carriers. Contact 106a of P region 102 and contact 106b of N region 104 are made on conductive regions 108a and 108b, respectively. Voltmeter 32 is attached to region 108a with wire lead 34a. Voltmeter 32 is also attached to sample 108b with wire lead 34b. Region 108a and 108b are isolated from the semiconductor regions 102 and 104 by insulating region 110.

Current source 22 is attached to ammeter 26 with wire lead 24c. Current source 22 is also connected to sample 108b with wire lead 24a. Ammeter 26 is connected to AFM 70 with wire lead 24b. This configuration allows AFM 70 to receive a current from current source 22 and inject the current from AFM tip 72 into selected portions of P region 102 and N region 104. Ammeter 26 will measure the current being supplied by current source 22.

The voltage measured by voltmeter 32 can be combined with the current reading of ammeter 26 to determine the voltage and current characteristics as a function of the position of tip 72 on sample 100. This information can be used to establish the electrical characteristics of semiconductor device 100 including resistance, and to delineate the spatial extent of the P-N junction including its depth. Use of the current source allows the measurement to be carried out in normal atmosphere since the contact potential of any surface oxidation is outside the voltage measurement loop.

For purposes of illustration we have chosen an N-doped region 104 embedded in a P-doped region 102. The method works equally well with a P-doped region 104 embedded in an N-doped region 102. Similarly, we have illustrated the method using edge-on geometry since this has the advantage of also allowing the determination of the depth of region 104 from its surface with insulator 110. The surface extent of region 104 in region 102 could be determined even more easily by this method by removing insulator 110 from over region 102 and region 104 and scanning the surface of the sample. For illustration purposes regions 102 and 104 have been shown as an isolated P-N junction. The methods detailed here work equally well for P-N junctions that are parts of transistors or other semiconductor devices by making a suitable rearrangement of the connections to the P regions and the N regions.

For simplicity, the measurements here have been illustrated as if DC measurements were made and DC measurements may suffice for some purposes. AC measurements of the voltage and current may also be employed and may include narrow-banding and other techniques to improve the signal to noise ratio of the measurements. Similarly, AC measurements using spatial modulation of the tip position can be substituted for the more common time modulation. If a sufficiently accurate current source can be used, it may likewise be substitute for the combination of the current source with the ammeter. A current source used with an ammeter may be desirable to verify correct operation.

Although the present invention and its advantages have been described in detail, it should be understood that various changes, substitutions, and alterations can be made therein without departing from the spirit and scope of the invention as defined by the appended claims.

What is claimed is:

1. A method of microscopic electrical measurement comprising the steps of:
   connecting a volt measurement system at two spaced apart points on a sample;
   connecting a conductive probe to the sample at a point on said sample between said two spaced apart points;
   injecting a measured current from a current source through the conductive probe and into the sample;
   moving the conductive probe to different locations on the sample between said two spaced apart points;
   recording the voltage across the two spaced apart points resulting from said injecting of a measured current as a function of the location of the probe on the sample; and
   recording the current injected into the sample as a function of the location of the probe on the sample.

2. The method of claim 1 further comprising the step of attaching an ammeter to the current source and the conductive probe to measure the amount of current flowing through the conductive probe.

3. The method of claim 1 wherein a constant current source is utilized to measure and control the current injected into the sample.

4. The method of claim 1 further comprising the step of providing a conductive probe tip on an arm of the conductive probe which is capable of conducting electricity.

5. The method of claim 1 further comprising the step of providing a Z-axis driver which is capable of measuring the vertical movement of the conductive probe.

6. The method of claim 1 further comprising the step of providing an X-Y scanstage into the design of the conductive probe which is capable of monitoring and recording the location of the conductive probe tip as it is moved across the sample.

7. A method of measuring the electrical characteristics as a function of position on a semiconductor device comprising the steps of:
   connecting a volt measurement system at two spaced apart points on a semiconductor device;
   providing a conductive probe;
   injecting a measured electric current into said conductive probe using a current source;
   providing a conductive tip on said conductive probe;
   contacting the conductive tip of the conductive probe with the semiconductor device at points on said semiconductor device between said two spaced apart points to allow current to flow through the semiconductor device from the current source to said two spaced apart points;
   recording the voltage measured by the volt measurement system across the two spaced apart points resulting from said injecting of a measured electric current as a function of the location of the conductive tip of the conductive probe on the semiconductor device; and
   recording the measured electric current as a function of the location of the conductive tip of the conductive probe on the sample.

8. The method of claim 7 further comprising the step of providing an ammeter coupled to the current source and the conductive probe to measure the current flowing through the conductive probe.

9. The method of claim 7 wherein a constant current source is provided to measure and control the current injected into the sample.

10. The method of claim 7 further comprising the step of providing a Z-axis driver into the conductive probe which is capable of measuring the vertical movement of an arm of the conductive probe.

11. The method of claim 7 further comprising the step of providing an X-Y scanstage into the design of the conductive probe which is capable of monitoring and recording the location of the conductive probe tip as it is scanned across a sample.

12. The method of claim 7 wherein the semiconductor device further comprises a P-N junction.

13. The method of claim 12 further comprising the steps of:
   measuring the depth of the P-N junction by sectioning the semiconductor device through the P-N junction; and
   forming a polished edge and recording the current and voltage as a function of location of the conductive tip on the polished edge.

14. A system for microscopic measurement of an electric field in a sample, said sample having a first end and a second end comprising:
   a sample having a first end and a second end;
   a voltmeter connected across said first end and said second end of said sample;
   a conductive probe connected to a current source for injecting current from the current source through the conductive probe and into the sample between said first end and said second end;
   a scanstage controller for scanning the conductive probe along the sample; and
   a recorder to record current flow and location of said conductive probe and voltage across said first end and said second end on the sample resulting from said injecting current and from said current source into said sample.

15. The system of claim 14 further comprising an ammeter connected to the current source for measuring the current supplied by the current source.

16. The system of claim 14 wherein the current source further comprises a constant current source capable of controlling and measuring the current injected into the sample.

17. The system of claim 14 wherein the conductive probe further comprises:
- a conductive tip;
- a conductive arm;
- the conductive tip attached to the conductive arm; and
- the conductive tip capable of being scanned across the sample to inject current into the sample.

18. The system of claim 14 further comprising a Z-axis driver capable of measuring the vertical movement of the arm of the conductive probe.

19. The system of claim 14 further comprising an X-Y scanstage capable of scanning the conductive probe across selected portions of the sample.

20. The system of claim 14 wherein the sample further comprises a semiconductor device with at least one P-N junction.

21. The system of claim 20 further comprising:
- a voltmeter connected with two electrically conductive leads extending from the semiconductor device; and
- a conductive tip carried by the conductive probe to inject electrical current at selected locations on the semiconductor device.

* * * * *